United States Patent
Lu et al.

(10) Patent No.: US 11,562,710 B2
(45) Date of Patent: Jan. 24, 2023

(54) LIGHT EMITTING DEVICE AND DISPLAY APPARATUS

(71) Applicants: Fuzhou BOE Optoelectronics Technology Co., Ltd., Fujian (CN); BOE Technology Group Co., Ltd., Beijing (CN)

(72) Inventors: Junxiang Lu, Beijing (CN); Moli Sun, Beijing (CN); Guiguang Hu, Beijing (CN); Shaojun Sun, Beijing (CN); Xia Chen, Beijing (CN); Fadian Le, Beijing (CN)

(73) Assignees: FUZHOU BOE OPTOELECTRONICS TECHNOLOGY CO., LTD., Fujian (CN); BOE TECHNOLOGY GROUP CO., LTD., Beijing (CN)

( * ) Notice: Subject to any disclaimer, the term of this patent is extended or adjusted under 35 U.S.C. 154(b) by 186 days.

(21) Appl. No.: 16/759,091

(22) PCT Filed: May 13, 2019

(86) PCT No.: PCT/CN2019/086628
§ 371 (c)(1),
(2) Date: Apr. 24, 2020

(87) PCT Pub. No.: WO2019/218964
PCT Pub. Date: Nov. 21, 2019

(65) Prior Publication Data
US 2021/0183330 A1 Jun. 17, 2021

(30) Foreign Application Priority Data
May 16, 2018 (CN) .......................... 201810467131.9

(51) Int. Cl.
G09G 3/38 (2006.01)
G02F 1/155 (2006.01)
(Continued)

(52) U.S. Cl.
CPC ............... *G09G 3/38* (2013.01); *G02F 1/155* (2013.01); *G09G 3/2003* (2013.01);
(Continued)

(58) Field of Classification Search
CPC ......... G09G 3/38; G09G 3/2003; G02F 1/155
See application file for complete search history.

(56) References Cited

U.S. PATENT DOCUMENTS 9,711,571 B2 *  7/2017 Kwon .................. H01L 51/5221
10,811,481 B2 * 10/2020 Hu ........................ G09G 3/3208
(Continued)

FOREIGN PATENT DOCUMENTS

CN       102244201 A      11/2011
CN       106450025 A       2/2017
(Continued)

*Primary Examiner* — Fred Tzeng
(74) *Attorney, Agent, or Firm* — Nath, Goldberg & Meyer; Joshua B. Goldberg

(57) ABSTRACT

The present disclosure provides a light emitting device and a display apparatus, The light emitting device includes a substrate, and a first electrode, a light emitting layer and a second electrode which are sequentially disposed on the substrate, an electrochromic substrate is disposed on the second electrode; the light emitting device further includes a chromaticity instrument, a processor, and a driver; the chromaticity instrument is configured to acquire chromaticity of light emitted by the light emitting device; the processor is configured to calculate compensated chromaticity for the light emitted by the light emitting device according to the chromaticity of the light emitted by the light emitting device acquired by the chromaticity instrument, and calculate an
(Continued)

electrical signal according to the compensated chromaticity for the light emitted by the light emitting device.

16 Claims, 1 Drawing Sheet

(51) Int. Cl.
*G09G 3/20* (2006.01)
*G02F 1/15* (2019.01)

(52) U.S. Cl.
CPC ............ *G02F 2001/164* (2019.01); *G09G 2320/0666* (2013.01); *G09G 2360/145* (2013.01)

(56) References Cited

U.S. PATENT DOCUMENTS

| | | | | |
|---|---|---|---|---|
| 2004/0070332 | A1* | 4/2004 | Miller | H01L 27/3211 313/498 |
| 2005/0259195 | A1* | 11/2005 | Koganezawa | G02F 1/133603 349/65 |
| 2008/0252202 | A1* | 10/2008 | Li | H01L 25/048 313/504 |
| 2008/0278792 | A1* | 11/2008 | Jang | G02F 1/15 359/266 |
| 2012/0098007 | A1* | 4/2012 | Kuo | G02F 1/157 257/98 |
| 2013/0194199 | A1* | 8/2013 | Lynch | G06F 3/0421 345/173 |
| 2013/0250187 | A1* | 9/2013 | Hanaoka | G09G 3/3413 348/790 |
| 2014/0211463 | A1* | 7/2014 | Hasumi | F21K 9/64 362/231 |
| 2014/0217924 | A1 | 8/2014 | Sato et al. | |
| 2015/0192835 | A1* | 7/2015 | Kim | G09G 3/035 345/589 |
| 2015/0241621 | A1* | 8/2015 | Inui | G02F 1/133615 349/65 |
| 2016/0079314 | A1* | 3/2016 | Seo | H01L 51/0073 257/40 |
| 2017/0031224 | A1* | 2/2017 | Gil | B05D 3/108 |
| 2017/0219901 | A1* | 8/2017 | Kumai | G02F 1/163 |
| 2017/0356608 | A1* | 12/2017 | Smith | F21V 9/40 |
| 2018/0063916 | A1* | 3/2018 | Ahn | H05B 45/12 |
| 2020/0165161 | A1* | 5/2020 | Berlinguette | C03C 17/25 |
| 2020/0241376 | A1* | 7/2020 | Garcia | E06B 9/24 |

FOREIGN PATENT DOCUMENTS

| | | |
|---|---|---|
| CN | 107394050 A | 11/2017 |
| CN | 107705753 A | 2/2018 |
| CN | 108417179 A | 8/2018 |
| CN | 208126846 U | 11/2018 |

* cited by examiner

LIGHT EMITTING DEVICE AND DISPLAY APPARATUS

CROSS-REFERENCE TO RELATED APPLICATION

This is a National Phase Application filed under 35 U.S.C. 371 as a national stage of PCT/CN2019/086628, filed on May 13, 2019, an application claiming the priority of the Chinese Patent Application No. 201810467131.9 filed on May 16, 2018, the contents of which are incorporated herein in their entirety by reference.

TECHNICAL FIELD

The present disclosure relates to the field of display technology, and particularly relates to a light emitting device and a display apparatus.

BACKGROUND

An OLED has received wide attention due to its advantages of self-luminescence, fast response, wide viewing angle, power saving, rich color, and could achieve flexible display, and therefore is a display technology with great potential to replace TFT-LCD. A white OLED can generate white light by mixing red, green and blue luminescent materials in a three-primary-color principle or complementary blue and yellow luminescent materials according to a certain proportion, each luminescent material may independently form a light emitting layer, or two or more luminescent materials may be mixed together to form a light emitting layer.

However, since photons of blue light have high energy, which easily causes decay of the blue luminescent material, the blue luminescent material has a short lifetime. Therefore, as an OLED device works, the white light turns yellow, chromaticity of the white light cannot be stabilized at a good level, which affects the luminescence performance of the white OLED seriously, and reduce the luminescence lifetime of the white OLED.

SUMMARY

The present disclosure provides a light emitting device, and a display apparatus.

The light emitting device includes a substrate, and a first electrode, a light emitting layer and a second electrode which are sequentially disposed on the substrate; the light emitting device further includes an electrochromic substrate disposed on the second electrode, a chromaticity instrument disposed on a light emitting side of the light emitting device, a processor and a driver; and the chromaticity instrument is configured to acquire chromaticity of light emitted by the light emitting device;
the processor is configured to calculate compensated chromaticity required for the light emitted by the light emitting device according to the chromaticity of the light emitted by the light emitting device acquired by the chromaticity instrument, and calculate an electrical signal according to the compensated chromaticity required by the light emitting device for compensation; and
the driver is configured to drive the electrochromic substrate to emit light with the electrical signal, to compensate for the chromaticity of the light emitted by the light emitting device.

Optionally, the light emitting device further includes a memory which stores a correspondence between chromaticity of light emitted by the light emitting device and compensated chromaticity required for the light; and
the processor is configured to calculate the compensated chromaticity for the light emitted by the light emitting device according to the chromaticity of the light emitted by the light emitting device acquired by the chromaticity instrument and the correspondence between the chromaticity of the light emitted by the light emitting device and the compensated chromaticity required for the light stored in the memory.

Optionally, the electrical signal includes a voltage signal; the memory further stores a correspondence between the compensated chromaticity required for the light and the voltage signal; and the processor is configured to calculate the electrical signal according to the compensated chromaticity required for the light and the correspondence between the compensated chromaticity required for the light and the voltage signal stored in the memory.

Optionally, the first electrode is a reflective anode; the second electrode is a transparent cathode; or
the first electrode is a reflective cathode; the second electrode is a transparent anode.

Optionally, the light emitting device includes a white light emitting device; the electrochromic substrate is a structure which emits blue light when an electrical signal is applied thereon and is transparent when no electrical signal is applied thereon.

Optionally, the electrochromic substrate includes a first transparent conductive layer, an electrochromic layer, an electrolyte layer and a second transparent conductive layer which are sequentially disposed on the second electrode.

Optionally, a material of the electrolyte layer includes an all-solid polymer electrolyte, a gel polymer electrolyte, or a composite of the all-solid polymer electrolyte and the gel polymer electrolyte.

Optionally, a material of the electrochromic layer includes $WO_3$ or Prussian white.

Optionally, the chromaticity instrument includes an optical system and an optical splitter; and
the optical system is configured to acquire light emitted by the light emitting device; and
the optical splitter is configured to obtain the chromaticity of the light emitted by the light emitting device by performing analysis and calculation for the light emitted by the light emitting device acquired by the optical system.

The display apparatus of the present disclosure includes the above light emitting device.

DETAILED DESCRIPTION

In order to enable those skilled in the art to better understand the technical solutions of the present disclosure, the present disclosure will be further described in detail below with reference to the accompanying drawings and the specific implementations.

Figure 1:
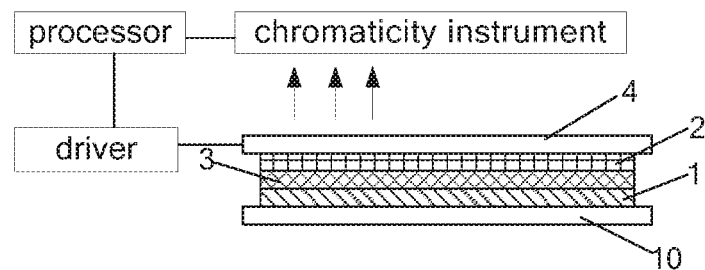
FIG. 1 is a schematic diagram of a structure of a light emitting device according to an embodiment of the present disclosure.
Figure 2:
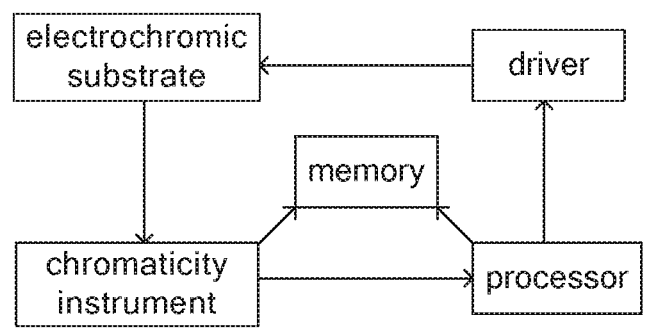
FIG. 2 is a schematic diagram illustrating modules in a light emitting device according to an embodiment of the present disclosure.

As shown in FIG. 1 and FIG. 2, a light emitting device is provided according to an embodiment, and the light emitting device may be an OLED device, and includes a substrate 10, and a first electrode 1, a light emitting layer 3 and a second electrode 2 which are sequentially disposed on the substrate 10, and an electrochromic substrate 4 disposed on the second electrode 2; the light emitting device further includes a chromaticity instrument, a processor, and a driver; the chromaticity instrument is configured to acquire chromaticity of light emitted by the light emitting device; the processor is configured to calculate a compensated chromaticity required for the light emitted by the light emitting device according to the chromaticity of the light emitted by the light emitting device acquired by the chromaticity instrument, and calculate an electrical signal according to the compensated chromaticity required for the light emitted by the light emitting device; and the electrochromic substrate 4 is configured to be driven to emit light by the driver with the calculated electrical signal, so as to compensate for the chromaticity of the light emitted by the light emitting device.

Since the chromaticity instrument, the processor and the driver are included in the light emitting device in the embodiment, the chromaticity of the light emitted by the light emitting device could be tested in real time with the chromaticity instrument, the processor could obtain an electrical signal corresponding to the compensated chromaticity required for the light by analysis of the chromaticity of the light emitted by the light emitting device through the chromaticity instrument, and the electrical signal is applied to the electrochromic substrate 4 by the driver to drive the electrochromic substrate 4 to emit light with the compensated chromaticity, so as to compensate for the chromaticity of the light emitted by the light emitting device, thereby enabling the light emitting device to stably emit light.

The light emitting device in the embodiment further includes a memory which stores a correspondence between chromaticity of light emitted by the light emitting device and compensated chromaticity required for the light; and the processor is configured to calculate the compensated chromaticity for the light emitted by the light emitting device according to the chromaticity of the light emitted by the light emitting device acquired by the chromaticity instrument and the correspondence between the chromaticity of the light emitted by the light emitting device and the compensated chromaticity required for the light stored in the memory.

The electrical signal comprises a voltage signal; the memory further stores a correspondence between the compensated chromaticity required for the light and the voltage signal; and the processor is configured to calculate the electrical signal according to the compensated chromaticity required for the light and the correspondence between the compensated chromaticity required for the light and the voltage signal stored in the memory.

In the embodiment, the first electrode 1 of the light emitting device is a reflective anode; the second electrode 2 is a transparent cathode; the reflective anode may be selected from an electrode, having reflectivity, such as Ag; and the transparent cathode may be made of an alloy of Mg/Ag, etc., or a metal/inorganic composite material.

Alternatively, the first electrode 1 of the light emitting device is a reflective cathode; and the second electrode 2 is a transparent anode. The reflective cathode may be made of a reflective metal material and an oxide thereof such as $Al_2O_3$; and the transparent anode may be made of ITO.

In order to clarify the structure of the light emitting device in the embodiment, the following description is given by taking an example that a light emitting device emits white light and chromaticity compensation is required to be performed on blue light. It should be noted that, the reason why it is required to compensate on the blue light for the white light emitting device is that the blue luminescent material is more easily aged in the white light emitting device.

Figure 3:
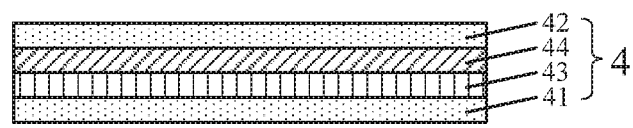
FIG. 3 is a schematic diagram of a structure of an electrochromic substrate of a light emitting device according to an embodiment of the present disclosure.

Since it is required to compensate on the chromaticity of the blue light in the white light emitting device, as shown in FIG. 3, the electrochromic substrate 4 in the embodiment may include a first transparent conductive layer 41, an electrochromic layer 43, an electrolyte layer 44, and a second transparent conductive layer 42 which are sequentially disposed on the second electrode 2 of the light emitting device.

A material of each of the first transparent conductive layer 41 and the second transparent conductive layer 42 includes a transparent conductive material such as ITO. The electrolyte layer 44 is made of an all-solid polymer electrolyte, a gel polymer electrolyte, or a composite of the all-solid polymer electrolyte and the gel polymer electrolyte. A material of the electrochromic layer 43 is $WO_3$ or Prussian white; when the material of the electrochromic layer 43 is $WO_3$, the electrochromic layer is a transparent film in an oxidation state of $WO_3$, and the electrochromic layer turns blue in a reduction state ($MxWO_3$) of $WO_3$; and when the material of the electrochromic layer 43 is Prussian white, the electrochromic layer is a transparent film, and the electrochromic layer turns blue when Prussian white is oxidized to Prussian blue.

After the chromaticity instrument acquires chromaticity of white light emitted by the light emitting device, the processor performs an operation according to chromaticity coordinates of initial white light and real-time white light emitted by the white light emitting device, which are acquired by the chromaticity instrument, to obtain blue light with compensated chromaticity, and the processor further calculates a corresponding electrical signal according to the blue light, and the electrical signal is applied to the first transparent conductive layer 41 and the second transparent conductive layer 42 of the electrochromic substrate 4 by the driver to make the electrochromic layer 43 emit the blue light, so as to compensate for the white light emitted by the light emitting device and enable the light emitting device to stably emit white light. When no voltage is applied to the electrochromic substrate 4, the electrochromic substrate 4 is transparent.

The chromaticity instrument in the embodiment includes an optical system and an optical splitter, the optical system is configured to acquire the light emitted by the light emitting device; the optical splitter is configured to obtain the chromaticity of the light emitted by the light emitting device by performing analysis and calculation for the light emitted by the light emitting device acquired by the optical system.

In the light emitting device in the embodiment, the processor is configured to calculate a corresponding electrical signal according to a real-time chromaticity of the light emitted by the light emitting device, and the driver drives the electrochromic substrate 4 with the corresponding electrical signal, so that the electrochromic substrate 4 changes from being transparent to being blue. Chromaticity coordinates of the white light emitting device could be monitored in real time, and compensation could be performed in real time according to color offset, so as to ensure a stable and pure-white display, improve display quality of the white light emitting device, and prolong service life of the white light emitting device.

As another aspect, a display apparatus is provided in an embodiment. The display apparatus includes the light emitting device in the above embodiment, so that the display apparatus has a good display effect.

The display apparatus in the embodiment may be any product or component having a display function, such as an OLED panel, electronic paper, a mobile phone, a tablet computer, a television, a display, a notebook computer, a digital photo frame, and a navigator.

It should be understood that, the above embodiments are merely exemplary embodiments that are employed to illustrate the principles of the present disclosure, and that the present disclosure is not limited thereto. Without departing from the spirit and essence of the present disclosure, various changes and modifications can be made by those skilled in the art, and should be considered to fall within the scope of the present disclosure.

What is claimed is:

1. A light emitting device, comprising a substrate, and a first electrode, a light emitting layer and a second electrode which are sequentially disposed on the substrate;
   wherein
   the light emitting device further comprises an electrochromic substrate disposed on the second electrode, a chromaticity instrument disposed on a light emitting side of the light emitting device, a processor and a driver;
   the chromaticity instrument is configured to acquire, in real time, chromaticity of light emitted by the light emitting device;
   the processor is configured to calculate compensated chromaticity required for the light emitted by the light emitting device according to the chromaticity of the light emitted by the light emitting device acquired by the chromaticity instrument, and calculate an electrical signal according to the compensated chromaticity required for the light; and
   the driver is configured to drive the electrochromic substrate to emit light with the electrical signal, to compensate for the chromaticity of the light emitted by the light emitting device,
   wherein the chromaticity instrument comprises an optical system and an optical splitter;
   the optical system is configured to acquire light emitted by the light emitting device; and
   the optical splitter is configured to obtain the chromaticity of the light emitted by the light emitting device by performing analysis and calculation for the light emitted by the light emitting device acquired by the optical system.

2. The light emitting device of claim 1, wherein the light emitting device further comprises a memory which stores a correspondence between chromaticity of light emitted by the light emitting device and compensated chromaticity required for the light; and
   the processor is configured to calculate the compensated chromaticity for the light emitted by the light emitting device according to the chromaticity of the light emitted by the light emitting device acquired by the chromaticity instrument and the correspondence between the chromaticity of the light emitted by the light emitting device and the compensated chromaticity required for the light stored in the memory.

3. The light emitting device of claim 2, wherein the electrical signal comprises a voltage signal; the memory further stores a correspondence between the compensated chromaticity required for the light and the voltage signal; and
   the processor is configured to calculate the electrical signal according to the compensated chromaticity required for the light and the correspondence between the compensated chromaticity required for the light and the voltage signal stored in the memory.

4. The light emitting device of claim 1, wherein the first electrode is a reflective anode; the second electrode is a transparent cathode; or
   the first electrode is a reflective cathode; the second electrode is a transparent anode.

5. The light emitting device of claim 1, wherein the light emitting device comprises a white light emitting device; and the electrochromic substrate is a structure which emits blue light when an electrical signal is applied thereon and is transparent when no electrical signal is applied thereon.

6. The light emitting device of claim 1, wherein the electrochromic substrate comprises a first transparent conductive layer, an electrochromic layer, an electrolyte layer and a second transparent conductive layer which are sequentially disposed on the second electrode.

7. The light emitting device of claim 6, wherein a material of the electrolyte layer comprises an all-solid polymer electrolyte, a gel polymer electrolyte, or a composite of the all-solid polymer electrolyte and the gel polymer electrolyte.

8. The light emitting device of claim 6, wherein a material of the electrochromic layer comprises WO3 or Prussian white.

9. A display apparatus, comprising the light emitting device of claim 1.

10. The display apparatus of claim 9, wherein the light emitting device further comprises a memory which stores a correspondence between chromaticity of light emitted by the light emitting device and compensated chromaticity required for the light; and the processor is configured to calculate the compensated chromaticity for the light emitted by the light emitting device according to the chromaticity of the light emitted by the light emitting device acquired by the chromaticity instrument and the correspondence between the chromaticity of the light emitted by the light emitting device and the compensated chromaticity required for the light stored in the memory.

11. The display apparatus of claim 10, wherein the electrical signal comprises a voltage signal; the memory further stores a correspondence between the compensated chromaticity required for the light and the voltage signal; and
    the processor is configured to calculate the electrical signal according to the compensated chromaticity required for the light and the correspondence between the compensated chromaticity required for the light and the voltage signal stored in the memory.

12. The display apparatus of claim 9, wherein the first electrode is a reflective anode; the second electrode is a transparent cathode; or
    the first electrode is a reflective cathode; the second electrode is a transparent anode.

13. The display apparatus of claim 9, wherein the light emitting device comprises a white light emitting device; and the electrochromic substrate is a structure which emits blue light when an electrical signal is applied thereon and is transparent when no electrical signal is applied thereon.

14. The display apparatus of claim 9, wherein the electrochromic substrate comprises a first transparent conductive layer, an electrochromic layer, an electrolyte layer and a second transparent conductive layer which are sequentially disposed on the second electrode.

15. The display apparatus of claim 14, wherein a material of the electrolyte layer comprises an all-solid polymer electrolyte, a gel polymer electrolyte, or a composite of the all-solid polymer electrolyte and the gel polymer electrolyte.

16. The display apparatus of claim 14, wherein a material of the electrochromic layer comprises WO3 or Prussian white.

* * * * *